United States Patent [19]
Murphy

[11] Patent Number: 5,877,554
[45] Date of Patent: Mar. 2, 1999

[54] CONVERTER SOCKET TERMINAL

[75] Inventor: James V. Murphy, Warwick, R.I.

[73] Assignee: Advanced Interconnections Corp., West Warwick, R.I.

[21] Appl. No.: 963,277

[22] Filed: Nov. 3, 1997

[51] Int. Cl.$^6$ ..................................................... H01L 23/34
[52] U.S. Cl. .......................................... 257/727; 257/780
[58] Field of Search .................................... 257/727, 780; 439/331, 332, 333, 334

[56] References Cited

U.S. PATENT DOCUMENTS

| | | |
|---|---|---|
| 4,616,895 | 10/1986 | Yoshizaki et al. . |
| 4,750,890 | 6/1988 | Dube et al. .............................. 439/330 |
| 5,227,718 | 7/1993 | Stowers et al. . |
| 5,420,519 | 5/1995 | Stowers et al. . |
| 5,451,165 | 9/1995 | Cearley-Cabbiness et al. ......... 257/727 |
| 5,545,050 | 8/1996 | Sato et al. ................................ 439/331 |
| 5,576,631 | 11/1996 | Stowers et al. . |
| 5,646,447 | 7/1997 | Ramsey et al. .......................... 257/727 |
| 5,647,756 | 7/1997 | Twigg et al. ............................. 439/331 |

*Primary Examiner*—Mahshid D. Saadat
*Assistant Examiner*—S. V. Clark
*Attorney, Agent, or Firm*—Fish & Richardson P.C.

[57] ABSTRACT

A socket terminal assembly includes a socket body having an end with an opening and an opposite end configured to contact the corresponding connection region of a printed circuit board, a contact spring, disposed at the opening of the socket body, to receive and apply a frictional force sufficient to retain the lower end of a pin within the opening of the socket body; and a resilient member, disposed within a lower end of the opening, to apply, to the pin and in response to a downward force applied to the pin, an upward force sufficient to overcome the frictional force of the contact spring. The pin has an end adapted to contact an electrical contacting area of an integrated circuit package and an opposite end configured to be inserted within the opening of the socket body. An intercoupling component includes a socket support member having holes, each hole receiving a corresponding socket terminal assembly.

28 Claims, 6 Drawing Sheets

CONVERTER SOCKET TERMINAL

BACKGROUND OF THE INVENTION

This invention relates to making connections between integrated circuit array packages (IC) and circuit boards.

Ball grid array (BGA) and land grid array (LGA) packages are becoming increasingly popular because of their low profiles and high densities. With a BGA package, for example, the rounded solder balls of the BGA are generally soldered directly to corresponding surface mount pads of a printed circuit board rather than to plated thru-holes which receive pins from, for example, a pin grid array IC package.

Sockets are used to allow particular IC packages to be interchanged without permanent connection to a circuit board. More recently, sockets for use with BGA and LGA packages have been developed to allow these packages to be non-permanently connected (e.g., for testing) to a circuit board. However, problems can exist in attaching a BGA package to conventional sockets. This is because a BGA package presents a non-traditional mating condition. The rounded solder balls of the BGA are themselves relatively poor points of contact for socketing, suited only for their intended purpose of being reflowed. Further, the co-planarity between the individual points of contact for each rounded solder ball may be lacking due to ball irregularities and warping of the BGA package.

SUMMARY OF THE INVENTION

This invention features a socket terminal assembly which provides a reliable, non-permanent and low-loss electrical interconnection between electrical contacting areas of an array package and connection regions of a substrate (e.g., printed circuit board) while duplicating the mating condition normally present between the electrical contacting areas and connection regions. The term "integrated circuit array package" is intended to mean those packages, including PGA (pin grid array), BGA and LGA packages. The term "substrate" is intended to mean any base member having electrical contact areas including printed circuit boards, IC chip substrates or the packages supporting such chip substrates.

In one aspect of the invention, the socket terminal assembly includes a contact spring, disposed within an opening of a socket body, to receive and apply a frictional force sufficient to retain a pin within the opening of the socket body; and a resilient member, disposed within the opening, to apply, in response to a downward force applied to the pin, an upward force to the pin sufficient to overcome the frictional force of the contact spring. The pin is adapted to contact the electrical contacting area of the integrated circuit array package. The socket body has an end configured to contact the corresponding connection region of the substrate and an opposite end having the opening for receiving the lower end of the pin.

Preferred embodiments of this aspect of the invention may include one or more of the following features. The contact spring is configured to provide a "wiping", reliable electrical contact in which the frictional force sufficient to retain the pin within the socket body is in a direction substantially transverse to the upward force applied by the resilient member. For example, the contact spring includes resilient spring fingers which frictionally engage the lower end of the pin. The resilient member for applying the upward force, on the other hand, is in the form of a coiled conductive spring, or alternatively, in the form of an elastomeric material (e.g., rubber).

The lower end of the socket body is ball-shaped or may include a solder ball attached thereto. The upper end of the pin includes a ball-contacting surface which is concave to receive a ball-shaped contact of a ball grid array package. A sharp protuberance extending from the ball-contacting surface may be provided to pierce the surface of the ball-shaped contact. The sharp protuberance is conically-shaped and disposed along the longitudinal axis of the pin. In other embodiments, the sharp protuberance may be ring-shaped and disposed concentric with the longitudinal axis. Alternatively, the upper end of the pin includes particle interconnections.

In another aspect of the invention, an intercoupling component (e.g., a socket assembly) includes a number of socket terminal assemblies, of the type described above, all of which are positioned within an array of holes or apertures in an insulative support member and configured to electrically connect the electrical contacting areas of the integrated circuit array package with the array of connection regions of the substrate. The array of holes in the support member are located in a pattern corresponding to the array of electrical connection regions of the substrate.

An intercoupling component having this arrangement eliminates the need for soldering the package directly to a circuit board (e.g., motherboard) and allows removing the integrated circuit array package in situations where the package needs to be repaired or replaced.

Preferred embodiments of this aspect of the invention may include one or more of the following features. The intercoupling component further includes an electrically insulative sheet coupled to the pins and having holes arranged in a pattern of the connection contacts. The sheet is formed, for example, of a polyimide film and adapted to retain the pins in a ganged arrangement. The intercoupling component further includes a member which applies a downward force on the contact area of the integrated circuit package and to each pin to cause the resilient member to compress. The member is a heat sink threadingly received within a cover positioned over the integrated circuit package. The terminal support member includes alignment elements to align the contacting area of the integrated circuit package to corresponding ones of the connection regions.

In another aspect of the invention, an intercoupling component includes a retaining member coupled to a plurality of pins received within a corresponding plurality of sockets which, in turn, are received within a socket support member having a detent. The returning member is configured to cooperate with the detent so that each of the pins are maintained with the sockets.

Preferred embodiments of this aspect of the invention may include one or more of the following features. The retaining member includes a relatively thin, electrically insulative, flexible sheet member (e.g., formed of polyimide) having holes extending therethrough and arranged in a planar configuration about the sheet to correspond with the predetermined positioning of the pins in the sockets. Each of the pins includes a head at the upper end of the pin, the head having an inwardly extending groove along its periphery. Each hole of the flexible sheet has a peripheral edge extending into a corresponding groove of the head of the pin. The detent is an opening formed in a sidewall which extends vertically from the upper surface of the socket support member and receives an edge of the flexible sheet. A detent may be formed in each of a pair of opposing sidewalls of the socket support member.

In another aspect of the invention, a terminal for electrically connect a solder ball contact area of a ball grid array package to a corresponding connection region of a substrate includes a head having a ball-contacting surface with a sharp protuberance extending vertically from a lowest point of the ball-contacting surface and below a highest point of the ball-contacting surface. The ball-contacting surface is concave and conically-shaped to receive the solder ball contact area. The sharp protuberance is configured to pierce the surface of the solder ball.

In embodiments of this aspect of the invention, the sharp protuberance is conically-shaped and lies along the longitudinal axis of the terminal. Alternatively, the sharp protuberance may be ring-shaped and disposed concentric with the longitudinal axis.

Other features of the invention will be apparent from the following description of the preferred embodiments and from the claims.

DESCRIPTION

Figure 1:
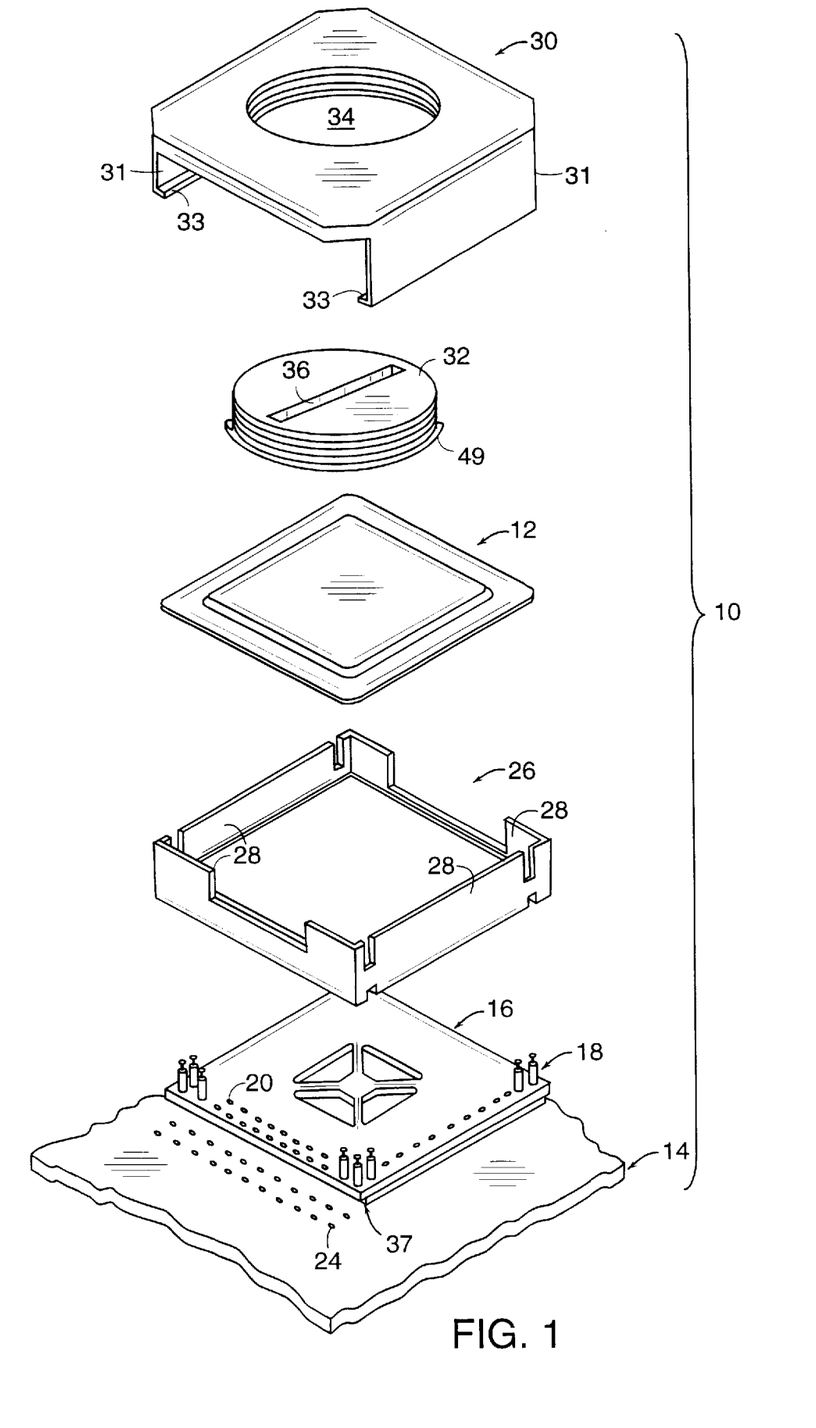
FIG. 1 is an exploded, somewhat diagrammatic, isometric view of a BGA converter socket assembly, a BGA package, and hold-down assembly positioned over a printed circuit board.
Figures 2, 3:
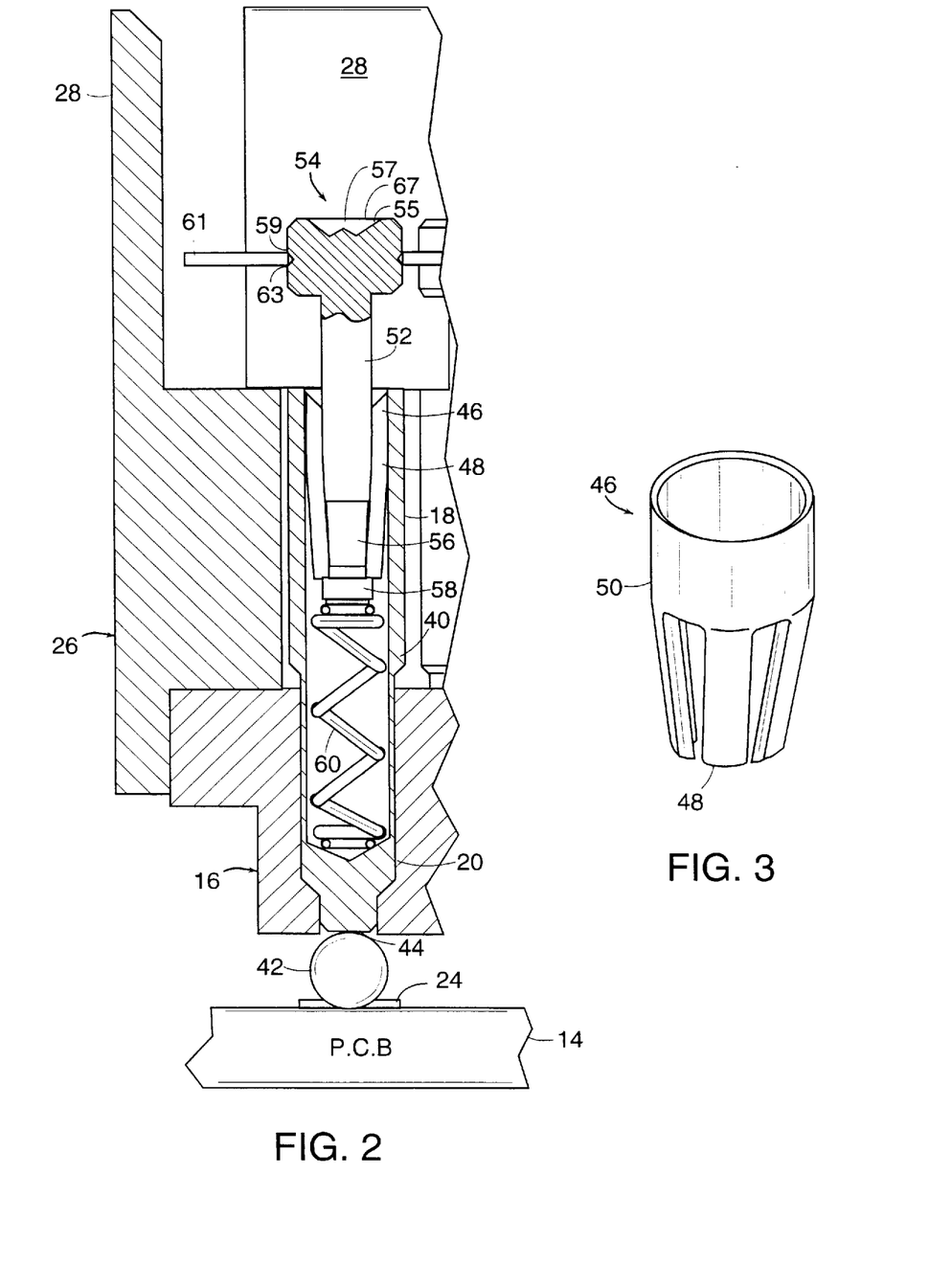
FIG. 2 is a cross-sectional side view of a portion of the BGA converter socket assembly of FIG. 1.
FIG. 3 is a perspective view of a contact spring of the BGA converter socket of FIG. 2.

Referring to FIGS. 1 and 2, a BGA socket converter assembly 10 for intercoupling a BGA package 12 to a printed circuit board 14 is shown. BGA socket converter assembly 10, serving as an intercoupling component, includes an electrically insulative member 16 for supporting converter socket terminals 18, each of which is press-fit within a corresponding one of an array of holes 20 (FIG. 2) in the insulative member. The array of holes 20 are provided in a pattern corresponding to a footprint of rounded solder balls 22 (FIG. 5B) of BGA package 12 as well as a footprint of surface mount pads 24 of printed circuit board 14. Insulative member 16 with converter socket terminals 18 is press-fit into a guide box 26 having sidewalls 28 along which the peripheral edges of BGA package 12 are guided so that solder balls 22 are aligned over converter socket terminals 18. Insulative member 16 and guide box 26 may be formed as a one-piece, integral unit, shown for example in FIG. 6.

BGA socket converter assembly 10 also includes a hold-down cover 30 for securing the BGA package 12 into the socket converter assembly. Cover 30 includes a pair of opposite walls 31 having tab members 33 which engage recessed portions 37 along the underside of insulative member 16. Hold-down cover 30 includes a threaded thru-hole 34 which threadingly receives a heat sink 32 to provide a thermal path for dissipating heat from the IC device generated within BGA package 12. Heat sink 32 is inserted and backed-in from the bottom of the cover 30 and includes a lip 49 which engages a flat counterbored surface (not shown) on the bottom surface of the cover to ensure that the heat sink will contact the surface of the BGA package. A slot 36 formed in the heat sink facilitates threading the heat sink within the cover, for example, with a screwdriver or coin. Other latching mechanisms (e.g., clips or catches) may also be used to secure BGA packages within the socket converter assembly. It is also appreciated that other heat sink arrangements, including those with increased surface area (e.g. heat sinks with finned arrangements), may be substituted for the lower profile version shown in FIG. 1. In some applications, a heat sink may not be required with only the cover providing the downward compressing force to the BGA package.

Referring to FIG. 2, each converter socket terminal 18 includes a female socket 40 positioned within one of the array of holes 20 of insulative member 16. Female socket 40 includes a solder ball 42 pre-attached (e.g., by soldering) to its bottom end 44 to provide an identical mating condition to surface mount pads 24 as would have been the case had BGA package 12 been connected directly to the printed circuit board 14. Solder balls 42 are eventually soldered to corresponding surface mount pads 24 of circuit board 14. Positioned within the interior of female socket 40 is a contact spring 46 press-fit within the interior and upper end of the female socket.

Referring to FIG. 3, each contact spring 46 includes spring leaves 48 attached at circumferentially spaced points of the lower end of a barrel 50. Contact spring 46 is sized to receive a male terminal 52 which passes through barrel 50 to frictionally engage spring leaves 48. Contact springs of this type are commercially available from Advanced Interconnections, West Warwick R.I. or other stamping outfits providing such contact springs (e.g., in an open-tooling arrangement). Spring leaves 48 provide a "wiping", reliable electrical contact to the male terminal pins by applying a frictional force in a direction substantially transverse to the longitudinal axis of the male terminals sufficient to retain the pin within the socket body.

Each male terminal 52 has a head 54 adapted to receive a corresponding ball 22 of the BGA package 12 and a pin 56, thereby forming an electrical connection between ball 22 (FIG. 5B) of package 12 and solder ball 42 of converter socket terminal 18. Head 54 has a concave upper surface 55 for accommodating the rounded shape of solder ball 22.

Figure 4:
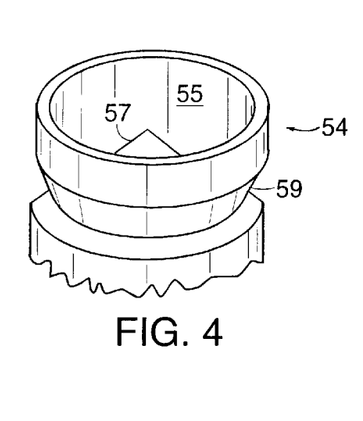
FIG. 4 is a perspective view of the head region of a pin which receives the solder balls of the BGA package of FIG. 1.

Referring again to FIG. 2 and FIG. 4, a relatively sharp projection 57 may be disposed concentrically on concave upper surface 55 of head 54. Projection 57 is used to pierce the outer surface of the BGA package's solder balls 22 which, due to exposure to the atmosphere, may have a layer of oxidation. Projection 57 is positioned at the lowest point within concave upper surface 55 with the tip of projection 57 substantially below the plane defined by the outer peripheral edge 67 of head 54. Thus, projection 57 is protected during tumbling operations, commonly performed on machined parts to remove sharp and irregular edges.

Figures 4A, 5B:
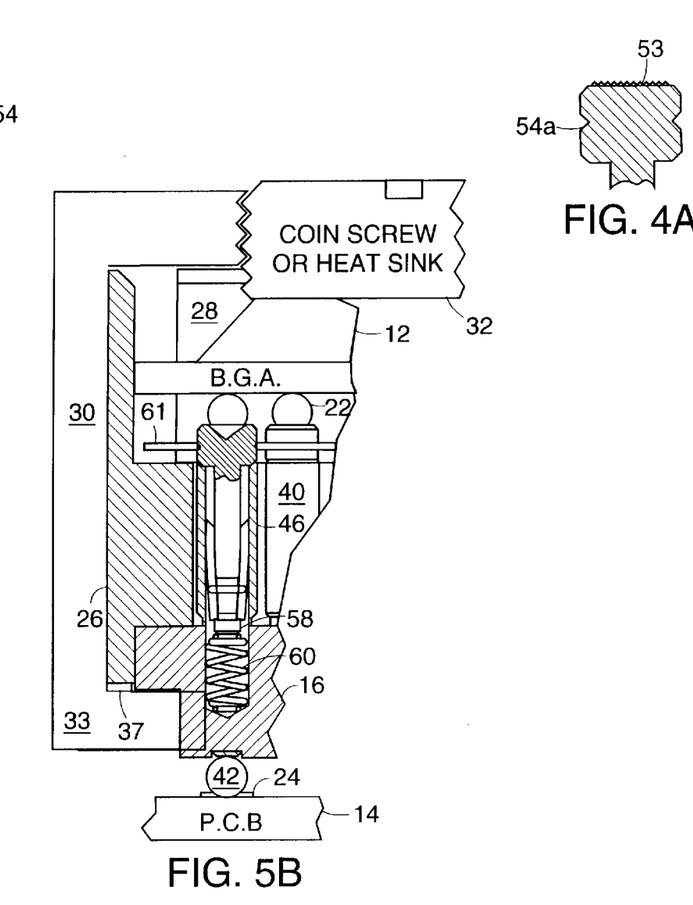
FIG. 4A is a cross-sectional side view of an alternative embodiment of the head region of a pin.
FIGS. 5A–5B are cross-sectional side views of the operation of the BGA converter socket assembly.

Referring to FIG. 4A, in an alternative embodiment, contacting surfaces of head 54a include particle interconnection (PI) 53 contacts. As described in U.S. Pat. No. 5,083,697 (incorporated by reference), particle interconnection contacts 53 include relatively hard metallized particles deposited in a soft metal layer such that they protrude from the surface of the contact. When a second contacting surface (e.g., ball) is compressively brought into contact with the PI contact, the hard particles penetrate any oxides and contamination present on the contacting surface. PI contacts minimize the resistance between the contacts, particularly after repeated insertions. Alternatively, a dendritic growth process may be used to improve the conductivity between contacts.

Referring again to FIG. 2, head 54 of each male terminal 52 also includes a V-groove 59 used to capture a relatively thin polymeric sheet 61 made, for example from Kapton® (a product of E.I. DuPont de Nemours and Co., Wilmington, Del.). Sheet 61 (not shown in FIG. 1 for purposes of clarity) includes openings 63 sized slightly smaller than the diameter of the heads 54. This arrangement maintains male terminals 52 together in proper spaced relationship so that the pins can be easily aligned over and inserted into female sockets 40. Sheet 61 also prevents tilting of the pins which can cause electrical shorting.

Each of pins 56 are received within corresponding contact springs 46 with spring leaves 48 configured to provide a lateral force, generally transverse to the longitudinal axis of pins 56, thereby frictionally engaging outer surfaces of the pins.

In one embodiment, the lower end of pin 56 includes a flattened head 58 having has a diameter slightly larger than the diameter of pin 56 so that after head 58 passes through spring leaves 48 of contact spring 46, male terminal 52 is captured within female socket 40.

Metallic coiled springs 60 are loosely positioned within the interiors of each of female sockets 40 and provide an upward force to the lower ends of pins 56. As mentioned earlier, spring leaves 48 of contact springs 46 provide a sufficient amount of lateral frictional force generally transverse to the longitudinal axis of the pins, to ensure a reliable electrical contact to pins 56 of male terminals 52. However, when hold-down cover 30 is removed from insulative member 16, guide box 26 and BGA package 12, metallic coiled springs 60 expand causing each of male terminals 52 to release and extend to their most vertical position within female sockets 40. Thus, it is important that coiled springs 60 provide an upward force to male terminal pins 52 that overcomes the frictional force, transverse to the upward force, applied by spring leaves 48. The upward force of coiled springs 60 also minimizes the risk of pins 56 "sticking" within corresponding female sockets 40.

Figure 5A:
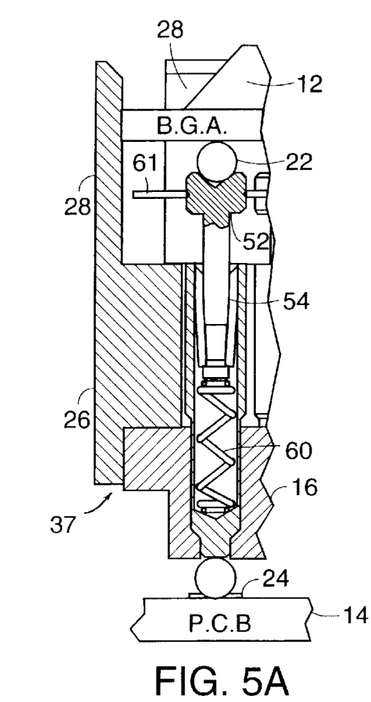

FIGS. 5A and 5B illustrate the operation of converter socket terminals 18. Referring to FIG. 5A, BGA package 12 is positioned within guide box 26, using sidewalls 28 of guide box 26, and over insulative member 16 with solder balls 22 of BGA package 12 resting on concave upper surface 55 of male terminals 52. In this position, male terminals 52 vertically extend from contact springs 46 to their greatest degree.

Referring to FIG. 5B, with cover 30 in use and heat sink 32 are slid over insulative member 16, guide box 26 and BGA package 12. Heat sink 32 is rotated within cover 30 using slot 36 until the heat sink contacts the upper surface of BGA package 12. Further rotation of heat sink 32 causes male terminal pins 52 to extend within female sockets 40 and against the bias of spring coils 60. Thus, electrical interconnections are completed from each of solder balls 22 of BGA package 12 to corresponding pads 24 of board 14, after solder balls 42 have been soldered to pads 24. Raising heat sink 32 from cover 30 removes the downward force applied to BGA package 12 with spring coils 60 returning male terminal pins 52 to their fully extended vertical position of FIG. 5A. With heat sink 32 in its raised position, cover 30 can be removed to allow, for example, substituting a different BGA package within the BGA converter socket assembly. The likelihood that one or more of male terminal pins 52 becoming stuck within female socket 40 is minimized because the pins are "ganged" together by polymeric sheet 61 which assists in ensuring that all of the pins return to their vertically extended position and at a consistent height. It is also important to note that each time a BGA package is secured within BGA socket converter assembly 10, pins 56 of male terminals 52 are "wiped" against spring leaves 48 of contact spring 46 to remove oxidation and ensure a reliable electrical connection therebetween.

Figure 6:
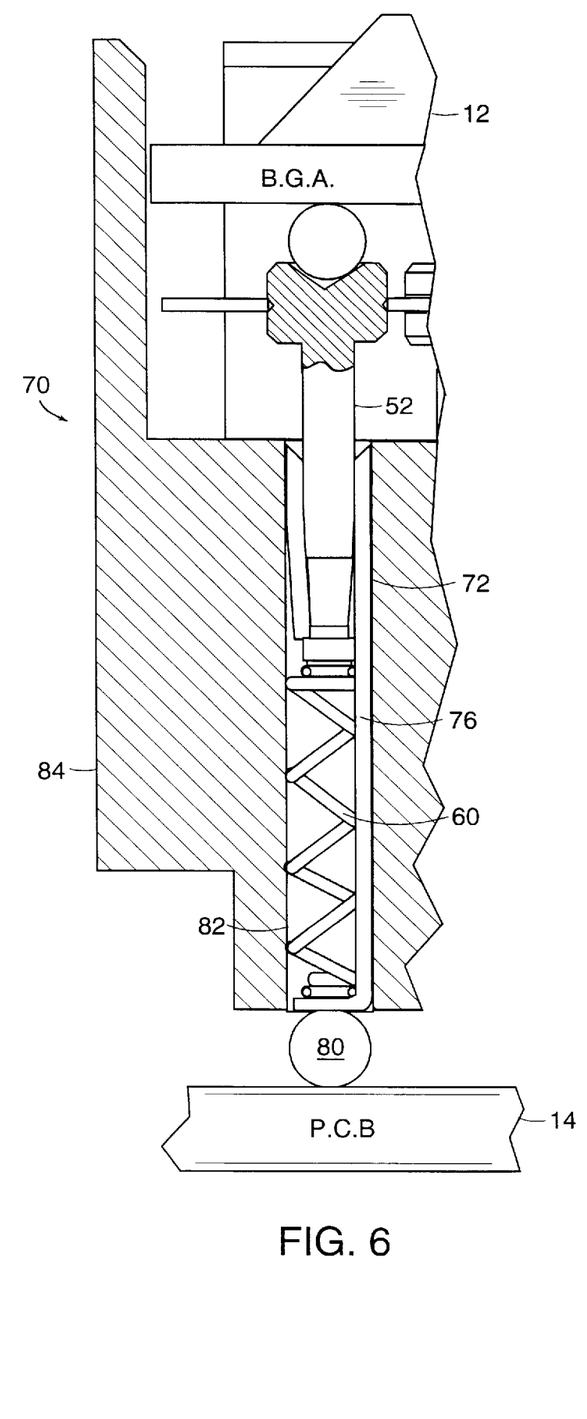
FIG. 6 is a cross-sectional side view of a second embodiment o a BGA converter socket assembly.
Figure 7:
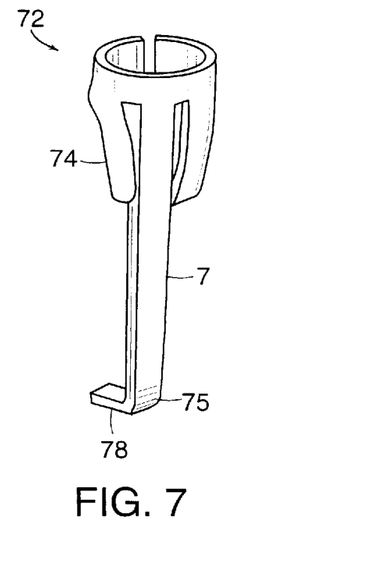
FIG. 7 is a perspective view of an alternative embodiment of he contact spring of the BGA converter socket assembly of FIG. 6.

Other embodiments are within the following claims. For example, in certain applications a reduced spacing or pitch between adjacent solder balls 22 may be required (e.g., 1 mm pitch or less). Referring to FIGS. 6 and 7, in such applications, a converter socket assembly 70 includes the male terminal pin 52 and coiled spring 60 used above in conjunction with the embodiment of FIGS. 1–5A and 5B. However, unlike the above described embodiment, converter socket assembly 70 does not include a female socket. Rather, converter socket assembly 70 includes a contact spring 72 having spring leaves 74. as well as a leg member 76 extending to a contact surface 78 having a solder ball 80 pre-attached thereto. Solder resist 75 is applied to a small area near the distal end of leg member 76 to facilitate attachment of solder ball 80 (FIG. 6) to contact surface 78. Solder resist 75 prevents, during soldering of the solder ball to contact surface 78, the solder from wicking up leg member 76. Contact spring is press-fit directly within a hole 82 formed within an insulative support member 84.

Figure 8:
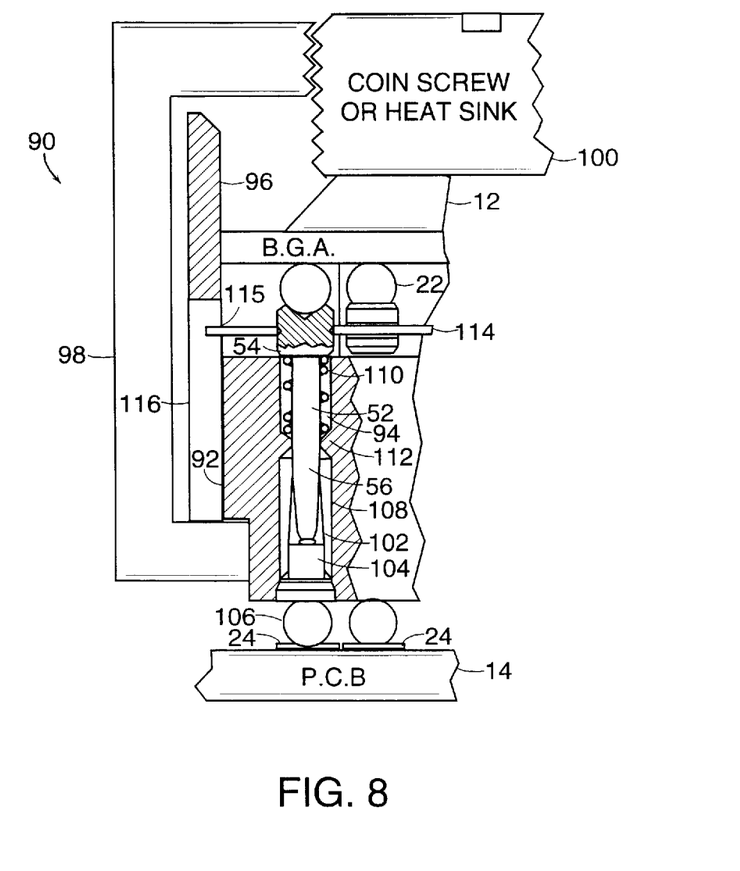
FIG. 8 is a cross-sectional side view of a third embodiment of a BGA converter socket assembly.

Referring to FIG. 8, in another embodiment of a BGA socket converter assembly 90, the positions of the contact spring and coiled spring are reversed. BGA socket converter assembly 90 includes an electrically insulative member 92 having an array of holes 94 extending therethrough in a pattern corresponding to a footprint of rounded solder balls 22 of BGA package 12 as well as a footprint of surface mount pads 24 of printed circuit board 14. Insulative member 92 includes integrally formed guide members 96 for facilitating insertion of BGA package 12. Insulative member 92, in essence, is an integrally-formed combination of the insulative member 16 and guide box 26 of FIGS. 1 and 2. Insulative member 92 is surrounded by a hold-down cover 98/heat sink 100 arrangement, similar to that described above in conjunction with FIG. 1. Positioned within a lower region of each hole 94 is a contact spring 102 having a head region 104 with a solder ball 106 attached thereto. Contact spring 102 includes spring leaves 108 which extend vertically to receive pin 56 of male terminal 52. A coiled spring 110 is positioned in the upper region of each hole 94 between a detent 112, formed within hole 94, and head 54 of male terminal 52.

In this embodiment, a retaining sheet 114 supports male terminals 52 and is sized slightly larger in one dimension (e.g., the width) so that one or more edges (or tabs) 115 of sheet 114 extends into openings 116 formed in the guide members 96 of insulative member 92. During assembly, the flexibility of the material permits the edge 115 to be bent sufficiently allowing it to slip within opening. Once in place, edges 115 of the sheet help to retain male terminals 52 within converter socket 90, particularly during handling and soldering of the converter socket to the printed circuit board.

Figure 9:
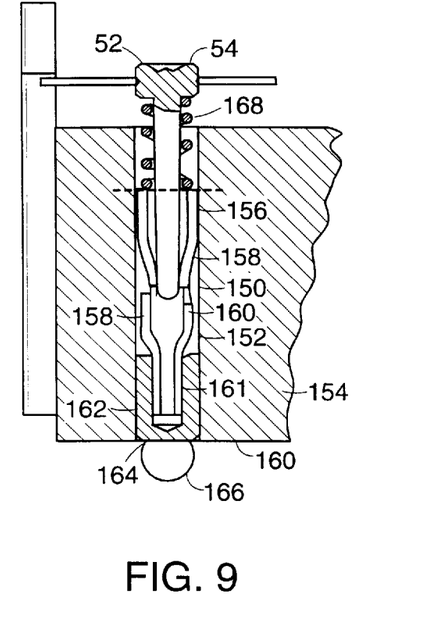
FIG. 9 is a ross-sectional side view of a fourth embodiment of a BGA converter socket assembly.
Figure 9A:
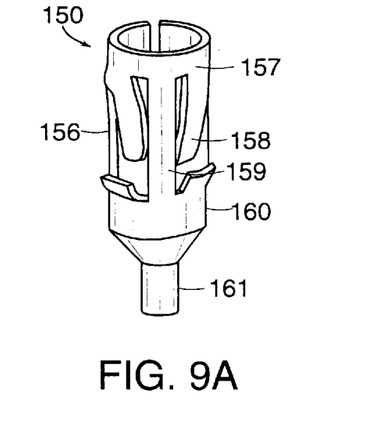
FIG. 9A is a perspective view of the contact spring of the BGA converter socket assembly of FIG. 9.

Other contact spring arrangements may be substituted for the contact spring 102 of BGA socket converter assembly 90. For example, referring to FIGS. 9 and 9A, a miniature contact assembly 150 is positioned within a hole 152 of an insulative support member 154. Miniature contact assembly 150 includes a body 156 having an upper barrel section 157 from which flexing spring fingers 158 extend. Flexing spring fingers receive pins 56 of male terminals 52. Upper barrel section also includes non-flexing fingers 159 which extend and connect to a lower barrel section 160 having a reduced diameter end 161 sized to be press-fit within a ferrule 162. Ferrule 162, in turn, is press-fit within the lower portion of hole 152 and provides a contact surface 164 where a solder ball 166 is attached. Miniature contact assembly 150 is commercially available from Ditron Inc., Stormville, N.Y. (Product No. D-14). A coiled spring 168 is positioned in the upper region of hole 152 between the upper end of contact assembly 150 and the head 54 of male terminal 52. In certain applications, ferrule 162 may not be required so that solder ball 166 directly contacts the distal ends of spring fingers 158.

In some applications, it may be desirable to replace male terminals 52. For example, in certain test applications, BGA packages are repeatedly removed and inserted in PGA socket converter assembly 90. In these applications, the head portion of the male terminal becomes contaminated with lead/tin solder from balls 22 of the BGA package or other residue. Build-up of the solder or residue can lead to poor electrical contact to the head portion.

Figure 10:
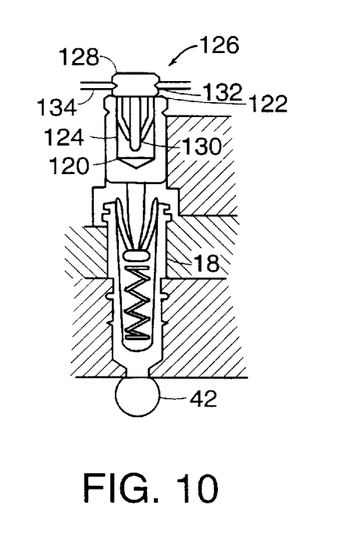
FIG. 10 is a cross-sectional side view of a fifth embodiment of a BGA converter socket assembly.

Referring to FIG. 10, to address this problem, each male terminal pin 120 includes spring fingers 122 press-fit within an opening 124 of the male terminal pin. A separate replaceable terminal 126 includes a head 128 having a pin 130 received by spring fingers 122. Head 128 includes a V-groove 132 for supporting a flexible retaining sheet 134 used to hold replaceable terminals 126 in the same manner described above in conjunction with FIG. 2. In the event that heads 128 become clogged with solder or otherwise contaminated with residue, retaining sheet 134 with replaceable terminals 126 is removed and discarded and a new retaining sheet with new replaceable terminals 126 is positioned within male terminal pins 120.

Figure 11:
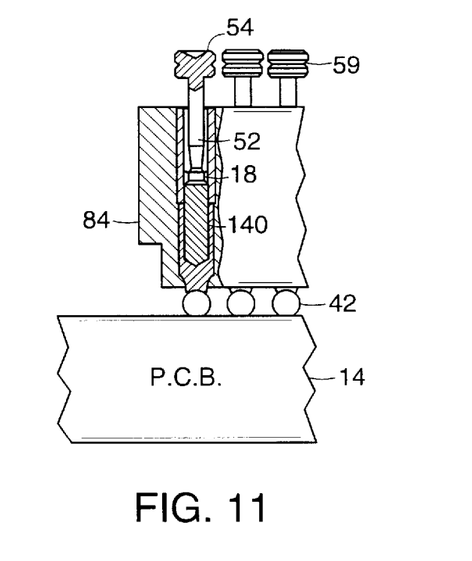
FIG. 11 is a cross-sectional side view of a sixth embodiment of a BGA converter socket assembly.

It is also appreciated that in the above described embodiments, other forms of spring members may be substituted for coiled springs 60 (FIG. 2). Referring to FIG. 11, for example, spring-like members 140 formed of elastomeric (e.g., rubber) or shape-memory materials may be used to provide the necessary upward force needed to overcome the frictional forces of contact springs 46.

Still further embodiments are supported by the following claims.

What is claimed is:

1. A socket terminal assembly of the type configured to electrically connect an electrical contacting area of an integrated circuit package to a corresponding connection region of a substrate and comprising:

a socket body having an end configured to contact the corresponding connection region of the substrate and an opposite end with an opening configured to receive an end of a pin, the pin having an opposite end adapted to contact the electrical contacting area of the integrated circuit package;

a contact spring, disposed at the opening of the socket body, to receive and apply a frictional force sufficient to retain the pin within the opening of the socket body; and a resilient member, disposed within the opening, to apply, in response to a downward force applied to the pin, an upward force to the pin sufficient to overcome the frictional force of the contact spring.

2. The socket terminal assembly of claim 1 wherein the frictional force applied by the contact spring is in a direction substantially transverse to the direction of the upward force applied by the resilient member.

3. The socket terminal assembly of claim 2 wherein the contact spring includes resilient spring fingers.

4. The socket terminal assembly of claim 2 wherein the resilient member includes a coiled conductive spring.

5. The socket terminal assembly of claim 2 wherein the resilient member is formed of an elastomeric material.

6. The socket terminal assembly of claim 1 wherein the end of the socket body configured to contact the corresponding connection region of the substrate is ball-shaped.

7. The socket terminal assembly of claim 6 wherein the ball-shaped end of the socket body is formed of a solder ball.

8. The socket terminal assembly of claim 1 further comprising the pin.

9. The socket terminal assembly of claim 8 wherein the electrical contacting area of the integrated circuit is a ball-shaped contact of a ball grid array package and the opposite end of the pin includes a concave ball-contacting surface to receive the ball-shaped contact.

10. The socket terminal assembly of claim 9 further comprising a sharp protuberance extending from the ball-contacting surface to pierce the surface of the ball-shaped contact.

11. The socket terminal assembly of claim 10 wherein the pin includes a longitudinal axis and the sharp protuberance is conically-shaped and disposed along the longitudinal axis.

12. The socket terminal assembly of claim 10 wherein the pin includes a longitudinal axis and the sharp protuberance is ring-shaped and disposed concentric with the longitudinal axis.

13. The socket terminal assembly of claim 1 further comprising particle interconnections disposed on the opposite end of the pin.

14. The socket terminal assembly of claim 1 wherein the pin includes an opening and resilient spring fingers disposed within the pin opening.

15. An intercoupling component comprising at least one socket terminal assembly as recited in claim 1; and a socket support member including openings extending therethrough from an upper surface to an opposite lower surface, the openings located in a pattern corresponding to a pattern of the connection contacts, each opening configured to receive the at least one socket terminal assembly.

16. The intercoupling component of claim 15 further comprising a plurality of socket terminal assemblies, each socket terminal assembly received within a corresponding opening of the socket support member.

17. The intercoupling component of claim 16 further comprising an electrically insulative sheet coupled to a corresponding pin, having a plurality of holes arranged in a pattern corresponding to the pattern of the connection contacts, each hole adapted to retain the pins.

18. The intercoupling component of claim 17 wherein the retaining sheet is a polyimide film.

19. The intercoupling component of claim 16 further comprising a member for applying a downward force on the contact area of the integrated circuit package and to each pin to cause the resilient member to compress.

20. The intercoupling component of claim 19 wherein the member for applying the downward force is a heat sink threadingly received within a cover positioned over the integrated circuit package.

21. The intercoupling component of claim 16 wherein the terminal support member includes alignment elements to align the contacting area of the integrated circuit package to corresponding ones of the connection regions.

22. An intercoupling component of the type used to electrically connect an electrical contacting area of an integrated circuit package to a corresponding connection region of a substrate, the intercoupling component comprising:

a socket support member including apertures located in a pattern corresponding to a pattern of the connection contacts and at least one detent, each aperture extending from an upper surface to an opposite lower surface of the socket support member;

a plurality of sockets, each socket received within a corresponding aperture of the socket support member and having an end configured to contact the corresponding connection region of the substrate and an opposite end with an opening;

a plurality of pins, each pin received within an opening of a corresponding socket and having an end adapted to contact the electrical contacting area of the integrated circuit package; and a retaining member coupled to each of the pins and configured to cooperate with the at least one detent so that the each of the pins are maintained within the opening of a corresponding socket.

23. The intercoupling component of claim 22 wherein the retaining member includes a relatively thin, electrically insulative, flexible sheet member having a plurality of holes extending therethrough, the holes arranged in a planar configuration about the sheet to correspond with the predetermined positioning of the pins in the sockets.

24. The intercoupling component of claim 23 wherein each of the pins includes a head at its upper end, the head having along its periphery an inwardly extending groove, each hole of the flexible sheet having a peripheral edge extending into a corresponding groove of the head of the pin.

25. The intercoupling component of claim 23 wherein the at least one detent is an opening formed in a sidewall which extends vertically from the upper surface of the socket support member and receives an edge of the flexible sheet.

26. A terminal of the type configured to electrically connect a solder ball of a ball grid array package to a corresponding connection region of a substrate, the terminal having a longitudinal axis and a head with a concave and conically-shaped ball-contacting surface to receive the solder ball, the ball-contacting surface having a sharp protuberance lying along the longitudinal axis and extending vertically from a lowest point of the ball-containing contacting surface and below a highest point of the ball-containing contacting surface, the sharp protuberance configured to pierce the surface of the solder ball.

27. The terminal of claim 26 wherein the sharp protuberance is conically-shaped and lies along the longitudinal axis of the terminal.

28. The terminal of claim 26 wherein the sharp protuberance is ring-shaped and is disposed concentric with the longitudinal axis.

* * * * *

UNITED STATES PATENT AND TRADEMARK OFFICE
CERTIFICATE OF CORRECTION

PATENT NO. : 5,877,554
DATED : March 2, 1999
INVENTOR(S) : James V. Murphy

It is certified that error appears in the above-identified patent and that said Letters Patent is hereby corrected as shown below:

Drawings,
FIG. 7, "7" should be -- 76 --.

Column 7,
Line 31, "PGA" should be -- BGA --.

Column 10,
Lines 24 and 26, after "ball-", delete "containing".

Signed and Sealed this

Ninth Day of March, 2004

JON W. DUDAS
*Acting Director of the United States Patent and Trademark Office*